US012588218B2

(12) United States Patent
Sung et al.

(10) Patent No.: US 12,588,218 B2
(45) Date of Patent: Mar. 24, 2026

(54) CHALCOGENIDE MATERIAL, SWITCHING DEVICE INCLUDING THE CHALCOGENIDE MATERIAL, AND MEMORY DEVICE INCLUDING THE SWITCHING DEVICE

(71) Applicant: Samsung Electronics Co., Ltd., Suwon-si (KR)

(72) Inventors: Hajun Sung, Suwon-si (KR); Youngjae Kang, Suwon-si (KR); Bonwon Koo, Suwon-si (KR); Yongyoung Park, Suwon-si (KR); Dongho Ahn, Suwon-si (KR); Kiyeon Yang, Suwon-si (KR); Wooyoung Yang, Suwon-si (KR); Changseung Lee, Suwon-si (KR); Minwoo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 349 days.

(21) Appl. No.: 18/176,750

(22) Filed: Mar. 1, 2023

(65) Prior Publication Data

US 2023/0329007 A1 Oct. 12, 2023

(30) Foreign Application Priority Data

Apr. 11, 2022 (KR) ........................ 10-2022-0044641
Nov. 29, 2022 (KR) ........................ 10-2022-0163416

(51) Int. Cl.
  *H10B 63/00* (2023.01)
  *H10B 61/00* (2023.01)
(52) U.S. Cl.
  CPC ............. *H10B 63/24* (2023.02); *H10B 61/10* (2023.02); *H10B 63/80* (2023.02)

(58) Field of Classification Search
  CPC ....... H10B 63/24; H10B 63/82; H10N 70/041
  See application file for complete search history.

(56) References Cited

U.S. PATENT DOCUMENTS 5,757,446 A    5/1998  Ovshinsky et al.
7,638,789 B2  12/2009  Peters
        (Continued)

FOREIGN PATENT DOCUMENTS

CN        108666417 A    10/2018
KR      2016-0021316 A     2/2016
        (Continued)

OTHER PUBLICATIONS

Xuecai Han et al: "Structure and Vibrational Modes of Ge—S—Se Glasses: Raman Scattering and AB Initio Calculations", Chalcogenide Letters, (Nov. 30, 2012), pp. 465-474, XP093067116.
        (Continued)

*Primary Examiner* — Mounir S Amer
(74) *Attorney, Agent, or Firm* — HARNESS, DICKEY & PIERCE, P.L.C.

(57) ABSTRACT

A chalcogenide material according to one embodiment includes germanium (Ge); arsenic (As); sulfur (S); selenium (Se), and at least one group III metal selected from indium (In), gallium (Ga), and aluminum (Al), wherein the content of the Ge may be greater than about 10 at % and less than or equal to about 30 at %, the content of the As may be greater than about 30 at % and less than or equal to about 50 at %, the content of Se is greater than about 20 at % and less than or equal to about 60 at %, the content of S is greater than about 0.5 at % and less than or equal to about 10 at %, and the content of the group III metal may be in the range of 0.5 at % to 10 at %.

20 Claims, 7 Drawing Sheets

(56)                    References Cited

U.S. PATENT DOCUMENTS

| | | | |
|---|---|---|---|
| 7,864,567 | B2 | 1/2011 | Gordon et al. |
| 9,379,321 | B1 | 6/2016 | Chang et al. |
| 9,704,921 | B2 | 7/2017 | Kim et al. |
| 9,748,311 | B2 | 8/2017 | Fantini et al. |
| 10,062,840 | B2 | 8/2018 | Sim et al. |
| 10,084,017 | B2 | 9/2018 | Ohba et al. |
| 10,163,977 | B1 | 12/2018 | Fantini et al. |
| 10,186,552 | B2 | 1/2019 | Choi et al. |
| 10,374,009 | B1 | 8/2019 | Cheng et al. |
| 10,727,405 | B2 * | 7/2020 | Varesi ................... G11C 13/003 |
| 10,868,249 | B2 | 12/2020 | Lee et al. |
| 11,040,395 | B2 * | 6/2021 | Li ........................ C22C 32/0063 |
| 11,818,899 | B2 * | 11/2023 | Yang ....................... H10B 63/84 |
| 2010/0163822 | A1 | 7/2010 | Ovshinsky et al. |
| 2014/0147965 | A1 | 5/2014 | Wicker et al. |
| 2016/0048046 | A1 | 2/2016 | Kim |
| 2017/0092460 | A1 | 3/2017 | Kiyohara et al. |
| 2017/0237000 | A1 | 8/2017 | Terai et al. |
| 2018/0277601 | A1 | 9/2018 | Ahn et al. |
| 2019/0148456 | A1 * | 5/2019 | Wu .................... H10N 70/8413 257/4 |
| 2019/0165264 | A1 | 5/2019 | Wu |
| 2019/0252609 | A1 | 8/2019 | Sei et al. |
| 2020/0321523 | A1 | 10/2020 | Varesi et al. |
| 2020/0411759 | A1 | 12/2020 | Sei et al. |
| 2021/0083185 | A1 | 3/2021 | Jung et al. |
| 2021/0111224 | A1 | 4/2021 | Cheng et al. |
| 2021/0249539 | A1 * | 8/2021 | Zhu ....................... H10D 64/689 |
| 2021/0288251 | A1 | 9/2021 | Cheng et al. |
| 2022/0052113 | A1 | 2/2022 | Lee et al. |
| 2022/0123209 | A1 | 4/2022 | Cheng et al. |
| 2022/0140003 | A1 | 5/2022 | Yang et al. |
| 2022/0367808 | A1 | 11/2022 | Kim et al. |
| 2023/0270025 | A1 * | 8/2023 | Collins ................ H10N 70/823 257/2 |
| 2023/0329007 | A1 * | 10/2023 | Sung .................. H10N 70/8413 257/5 |
| 2023/0402095 | A1 * | 12/2023 | Lee .................... H10N 70/8825 |

FOREIGN PATENT DOCUMENTS

| | | | |
|---|---|---|---|
| KR | 2017-0038666 | A | 4/2017 |
| KR | 2019-0057058 | A | 5/2019 |
| TW | I757029 | B | 3/2022 |
| WO | WO-2019/167538 | A1 | 9/2019 |
| WO | WO-2021-096288 | A1 | 5/2021 |

OTHER PUBLICATIONS

Ghayebloo M et al: "Effect of replacement of Se by S on structural and physical properties of Ge—Sb—As—Se—S chalcogenide glasses", Optical and Quantum Electronics, Springer US, New York, (Jul. 24, 2017), pp. 1-11, XP36286261.

Jun Sukhwan et al: "Amorphous Ge—Se—S chalcogenide alloys via post plasma sulfurization of atomic layer deposition GeSe for ovonic threshold switch application", Journal of Alloys and Compounds, (Mar. 5, 2023), p. 169514, XP93067511.

A. Hosseinkhani et al, "The optical, structural and thermal optimizations of . . . " Infrared Physics & Technology, vol. 85, 2017, pp. 421-430.

EESR dated Aug. 28, 2023 for corresponding EP Patent Application No. 23162596.3.

Korean Office Action dated Feb. 9, 2026 for corresponding Korean Patent Application No. 10-2022-0163416 and its English-language translation.

* cited by examiner

CHALCOGENIDE MATERIAL, SWITCHING DEVICE INCLUDING THE CHALCOGENIDE MATERIAL, AND MEMORY DEVICE INCLUDING THE SWITCHING DEVICE

CROSS-REFERENCE TO RELATED APPLICATION

This application is based on and claims priority under 35 U.S.C. § 119 to Korean Patent Application No. 10-2022-0044641, filed on Apr. 11, 2022, and Korean Patent Application No. 10-2022-0163416, filed on Nov. 29, 2022 in the Korean Intellectual Property Office, the disclosure of each of which is incorporated by reference herein in its entirety.

BACKGROUND

Various example embodiments relate to a chalcogenide material, a switching device including the chalcogenide material, and/or a memory device including the switching device.

Recently, with the miniaturization and high performance of electronic devices, a memory device capable of storing information in various electronic devices, such as computers and portable communication devices, has been required. Memory devices include one or more of phase-change random access memory (PRAM), resistive random access memory (RRAM), magnetic random access memory (MRAM), and the like, which can store data using characteristics that between different resistance states switch according to applied voltages or currents. Such memory devices may include an ovonic threshold switch (OTS)-based switching device using a chalcogenide material. When the bonding between components forming chalcogenide material is unstable, the chalcogenide material used in a switching device may degrade the reliability and endurance of a memory device due to phase separation by repeated switching.

SUMMARY

Provided is a chalcogenide material with a composition that has high endurance, low leakage current, and/or a suppressed or reduced threshold voltage drift.

Alternatively or additionally, provided is a switching device including the chalcogenide material in which structural stability is improved and/or threshold voltage drift is suppressed or reduced.

Alternatively or additionally, provided is a memory device with improved structural stability and suppressed or reduced threshold voltage drift, including the chalcogenide material.

Additional aspects will be set forth in part in the description which follows and, in part, will be apparent from the description, or may be learned by practice of the presented embodiments of the disclosure.

According to some example embodiments, there is provided a chalcogenide material including: germanium (Ge); arsenic (As); sulfur (S); selenium (Se); and at least one group III metal selected from indium (In), gallium (Ga), and aluminum (Al). The content of Ge may be greater than about 10 at % and less than or equal to about 30 at %, the content of As may be greater than about 30 at % and less than or equal to about 50 at %, the content of Se may be greater than about 20 at % and less than or equal to about 60 at %, the content of S may be greater than about 0.5 at % and less than or equal to about 10 at %, and the content of the group III metal may be greater than about 0.5 at % and less than or equal to about 10 at %.

The sum of the content of the S and the content of the Se in the chalcogenide material may be greater than about 20 at % and less than or equal to about 60 at %.

In the chalcogenide material, the Ge may be bonded to the S, and the Se may be bonded to the group III metal.

The ratio of the group III metal to the S in the chalcogenide material may be about 1:1 or more and about 1:10 or less.

The content of the As in the chalcogenide material may be greater than about 35 at % and less than or equal to about 50 at %.

The content of the As in the chalcogenide material may be greater than about 40 at % and less than or equal to about 50 at %.

According to some example embodiments, there is provided a switching device including: a first electrode layer; a second electrode layer facing the first electrode layer; and a selection layer between the first electrode layer and the second electrode layer. The selection layer includes a chalcogenide material including: germanium (Ge); arsenic (As); sulfur (S); selenium (Se); and at least one group III metal selected from indium (In), gallium (Ga), and aluminum (Al), and wherein the content of Ge may be greater than about 10 at % and less than or equal to about 30 at %, the content of As may be greater than about 30 at % and less than or equal to about 50 at %, the content of Se may be greater than about 20 at % and less than or equal to about 60 at %, the content of S may be greater than about 0.5 at % and less than or equal to about 10 at %, and the content of the group III metal may be greater than about 0.5 at % and less than or equal to about 10 at %.

The sum of the content of the S and the content of the Se in the switching device may be greater than about 20 at % and less than or equal to about 60 at %.

In the switching device, the Ge may be bonded to the S, and the Se may be bonded to the group III metal.

The ratio of the group III metal to the S in the switching device may be about 1:1 or more and about 1:10 or less.

The content of the As in the switching device may be greater than about 35 at % and less than or equal to about 50 at %.

The content of the As in the switching device may be greater than about 40 at % and less than or equal to about 50 at %.

In the switching device, the chalcogenide material may exhibit ovonic threshold switching material characteristics.

According to some example embodiments, there is provided a memory device including: a plurality of first electrode lines extending in a first direction and spaced apart from each other; a plurality of second electrode lines extending in a second direction crossing the first direction and spaced apart from each other, and a plurality of memory cells electrically connected between the plurality of the first electrode lines and the plurality of the second electrode lines, respectively, at intersections of the plurality of the first electrode lines and the plurality of the second electrode lines, wherein each of the plurality of memory cells includes a selection layer and a variable resistor layer which are connected in series. The selection layer includes a chalcogenide material including: germanium (Ge); arsenic (As); sulfur (S); selenium (Se); and at least one group III metal selected from indium (In), gallium (Ga), and aluminum (Al). The content of the Ge may be greater than about 10 at % and less than or equal to about 30 at %, the content of the As may be greater than about 30 at % and less than or equal to about 50 at %, the content of Se may be greater than about 20 at % and less than or equal to about 60 at %, the content of S may be greater than about 0.5 at % and less than or equal to about 10 at %, and the content of the group III metal may be greater than about 0.5 at % and less than or equal to about 10 at %.

The sum of the content of the S and the content of the Se in the memory device may be greater than about 20 at % and less than or equal to about 60 at %.

In the memory device, the Ge may be bonded to the S, and the Se may be bonded to the group III metal.

The ratio of the group III metal to the S in the memory device may be about 1:1 or more and about 1:10 or less.

In the memory device, the chalcogenide material may exhibit ovonic threshold switching material characteristics.

The memory device may further include a third electrode layer arranged between the selection layer and the variable resistor layer.

The memory device may have a three-dimensional (3D) cross-point array structure.

The memory device may include at least one of PRAM, RRAM, or MRAM.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
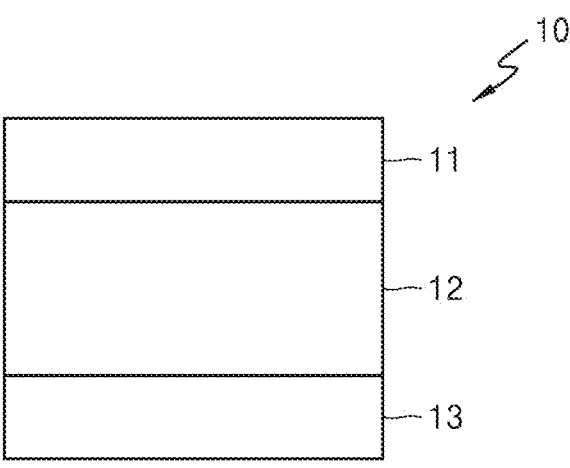
FIG. 1 is a cross-sectional view of a switching device according to various example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a chalcogenide material, a switching device including the chalcogenide material, and a memory device including the switching device will be described in detail with reference to the accompanying drawings. In the following drawings, the same reference numerals refer to the same components, and the size of each component in the drawings may be exaggerated for clarity and convenience of description. In addition, the embodiments described below are merely exemplary and various modifications are possible from these various embodiments.

Hereinafter, the term "upper portion" or "on" may also include "to be present above, below, in the left and right sides on a non-contact basis" as well as "to be on the top, bottom, left, and right portions in directly contact with". The singular expression includes plural expressions unless the context clearly implies otherwise. In addition, when a part "includes" a component, this means that it may further include other components, not excluding other components unless otherwise opposed.

The use of the term "the" and similar indicative terms may correspond to both singular and plural. If there is no explicit description or contrary description of the order of the steps or operations constituting the method, these steps or operations may be carried out in an appropriate order and are not necessarily limited to the described order.

The connection or connection members of the lines between the components illustrated in the drawings exemplarily show functional connection and/or physical or circuit connection, and the actual device may be represented as alternative or additional various functional connections, physical connections, or circuit connections.

The use of all example terms is merely for describing a technical idea in detail and the scope is not limited to the examples or exemplary terms unless limited by the claims.

FIG. 1 is a cross-sectional view of a switching device according to various example embodiments.

Referring to FIG. 1, a switching device 10 may include a first electrode layer 11, a second electrode layer 13 arranged to face the first electrode layer 11, and a selection layer 12 arranged between the first electrode layer 11 and the second electrode layer 13. The selection layer 12 may be electrically connected between, e.g. connected or directly connected between, the first electrode layer 11 and the second electrode layer 13.

According to various example embodiments, the first electrode layer 11 and the second electrode layer 13 may be or may include paths through which current flows. When a voltage greater than a threshold voltage is applied between the first electrode layer 11 and the second electrode layer 13 of the switching device 10, the selection layer 12 becomes a low resistance state to start or enable a current flow, and when a voltage less than a threshold voltage is applied between the first electrode layer 11 and the second electrode layer 13 of the switching device 10, the selection layer 12 returns to a high resistance state so that no or a small amount of current flows. In addition, when the current flowing through the selection layer 12 becomes smaller than the holding current, the selection layer 12 may be changed to a high resistance state. Accordingly, the switching device 10 may be turned on/off according to a voltage applied between the first electrode layer 11 and the second electrode layer 13.

The first electrode layer 11 and the second electrode layer 13 may be formed of, e.g. may consist of or may include, a conductive material. For example, the conductive material may be made of a metal, a conductive metal oxide, a conductive metal nitride, or a combination thereof. For example, the conductive material may include one or more selected from carbon (C), titanium nitride (Ti), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), and is not limited thereto.

The selection layer 12 may include a chalcogenide material having an ovonic threshold switch (OTS) characteristic. For example, the selection layer 12 may include a chalcogenide material including: germanium (Ge); arsenic (As); sulfur (S); selenium (Se); and a group III metal. The group III metal may include at least one selected from, for example, indium (In), gallium (Ga), and aluminum (Al).

The selection layer 12 may be formed using deposition and may be formed, for example, using physical chemical vapor (PVD) deposition such as a sputter deposition process.

Alternatively or additionally, the selection layer 12 may be formed by a PVD process using at least one target including a chalcogenide material including germanium (Ge), arsenic (As), sulfur (S), selenium (Se), and a group III metal. The group III metal may include at least one selected from indium (In), gallium (Ga), and aluminum (Al). The at least one target may include a target including: germanium (Ge); arsenic (As); sulfur (S); selenium (Se); and a group III metal. The group III metal may include at least one selected from, for example, indium (In), gallium (Ga), and aluminum (Al).

Alternatively or additionally, the selection layer 12 may be formed by a chemical vapor deposition (CVD) process and/or an atomic layer deposition (ALD) process using a plurality of sources including a chalcogenide material including germanium (Ge), arsenic (As), sulfur (S), selenium (Se), and a group III metal. The group III metal may include at least one selected from, for example, indium (In), gallium (Ga), and aluminum (Al).

The selection layer 12 may be formed to have a thin thickness by co-sputtering deposition. For example, the thickness of the selection layer 12 may be greater than about 5 nm and less than or equal to about 50 nm, or greater than about 5 nm and less than or equal to about 30 nm.

Due to the chalcogenide material having improved structural stability of the selection layer 12, the switching device 10 has a reduced leakage current, and a suppressed or reduced threshold voltage drift to thereby have an improved or excellent endurance and realize stable switching characteristics. Germanium (Ge), which is vulnerable to atomic migration in an electric field during frequent switching, is bonded to sulfur (S), and selenium (Se) is bonded to a metal, thereby having improved or excellent endurance.

The content of the germanium (Ge) component of the chalcogenide material of the selection layer 12 may be greater than about 10 at % and less than or equal to about 30 at %. The germanium (Ge) component may improve the thermal stability of the chalcogenide material in the range having the content above, thereby realizing stable switching characteristics. When the content of the Ge component is less than about 10 at %, the chalcogenide material may not have enough thermal stability to be used or to be useful in the memory device. When the content of the germanium (Ge) component is greater than about 30 at %, the leakage current may increase or the switch may not be turned off, and thus, stable switching characteristics may not be exhibited.

The content of the arsenic (As) component of the chalcogenide material of the selection layer 12 may be greater than about 30 at % and less than or equal to about 50 at %. For example, the content of the arsenic (As) component of the chalcogenide material of the selection layer 12 may be greater than about 35 at % and less than or equal to about 50 at %. For example, the content of the arsenic (As) component of the chalcogenide material of the selection layer 12 may be greater than about 40 at % and less than or equal to about 50 at %. The arsenic (As) component may improve the thermal stability of the chalcogenide material in the range having the content above. For example, arsenic (As) may increase the volatilization temperature and/or the crystallization temperature of the chalcogenide material, thereby improving the thermal stability of the switching device, including the chalcogenide material. For example, the chalcogenide material may have a relatively high volatilization temperature and crystallization temperature, and damage or degradation of the chalcogenide material may be prevented in a process of manufacturing a memory device by using the chalcogenide material.

The selenium (Se) component of the chalcogenide material of the selection layer 12 may have a content greater than about 20 at % and less than or equal to about 60 at %. The sulfur (S) component of the chalcogenide material of the selection layer 12 may have a content greater than about 0.5 at % and less than or equal to about 10 at %. The sum of the selenium (Se) component and the sulfur (S) component of the chalcogenide material of the selection layer 12 may have a content greater than about 20 at % and less than or equal to about 60 at %.

Figure 2:
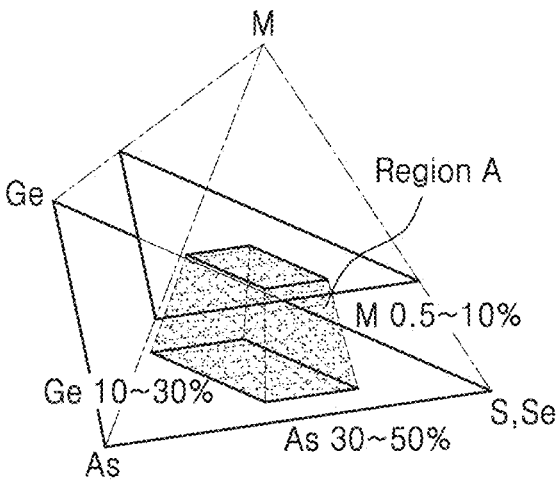
FIG. 2 is a three-dimensional composition diagram illustrating a composition region of a chalcogenide material according to various example embodiments.

FIG. 2 is a three-dimensional composition diagram illustrating a composition region of a chalcogenide material according to various example embodiments.

For example, a chalcogenide material includes: germanium (Ge); arsenic (As); sulfur (S); selenium (Se); and at least one group III metal selected from indium (In), gallium (Ga), and aluminum (Al).

For example, the content of germanium in the chalcogenide material may be greater than about 10 at % and less than or equal to about 30 at %.

For example, the content of arsenic in the chalcogenide material may be greater than about 30 at % and less than or equal to about 50 at %, preferably greater than about 35 at % and less than or equal to about 50 at %, and more preferably greater than about 40 at % and less than or equal to about 50 at %.

For example, the content of selenium in the chalcogenide material may be greater than about 20 at % and less than or equal to about 60 at %.

For example, the content of sulfur in the chalcogenide material may be greater than about 0.5 at % and less than or equal to about 10 at %.

For example, the content of the group III metal of the chalcogenide material may be greater than about 0.5 at % and less than or equal to about 10 at %.

The sum of the content of the S and the content of the Se in the chalcogenide material may be greater than about 20 at % and less than or equal to about 60 at %.

The ratio of the group III metal to the S in the chalcogenide material may be about 1:1 or more and about 1:10 or less.

For example, the chalcogenide material may include a compound represented by the following Chemical Formula 1:

$$Ge_a As_b M_c (S_d Se_e)_{1-a-b-c} \qquad \text{[Chemical Formula 1]}$$

In Chemical Formula 1, M may be at least one group III metal element selected from indium (In), gallium (Ga), and aluminum (Al), with $0.10 \leq a \leq 0.30$, $0.30 \leq b \leq 0.50$, $0.005 \leq c \leq 0.10$, and $a+b+c+d+e=1$. In addition, c:d=about 1:1 to about 1:10.

The chalcogenide material may include sulfur (S) bonded to germanium (Ge) and a metal bonded to selenium (Se). Accordingly, in a switching device and a memory device using a chalcogenide material as a selection layer, threshold voltage drift is suppressed or reduced, thereby improving structural stability.

The chalcogenide material according to some example embodiments may not include silicon (Si). When the chalcogenide material includes silicon, it may be difficult to form a selection layer of good or excellent quality. For example, in order to form a selection layer, a chalcogenide material is sintered to form a target, and a layer of the chalcogenide material from the target may be formed on a substrate by the collision of argon gas through a PVD process. However, when silicon is included in the chalcogenide material, silicon particles in the target may be agglomerated and separated and/or pores may be more easily generated during the target formation process, and thus, silicon particles may be agglomerated and separated in the selection layer. Accordingly, the selection layer may have a non-uniform composition distribution and/or a non-uniform thickness, and the film quality of the selection layer may degrade. However, the chalcogenide material according to various example embodiments does not include silicon (Si), and thus, a target having improved or excellent quality may be formed, and the selection layer formed using the target may have improved or excellent film quality.

Figure 3A:
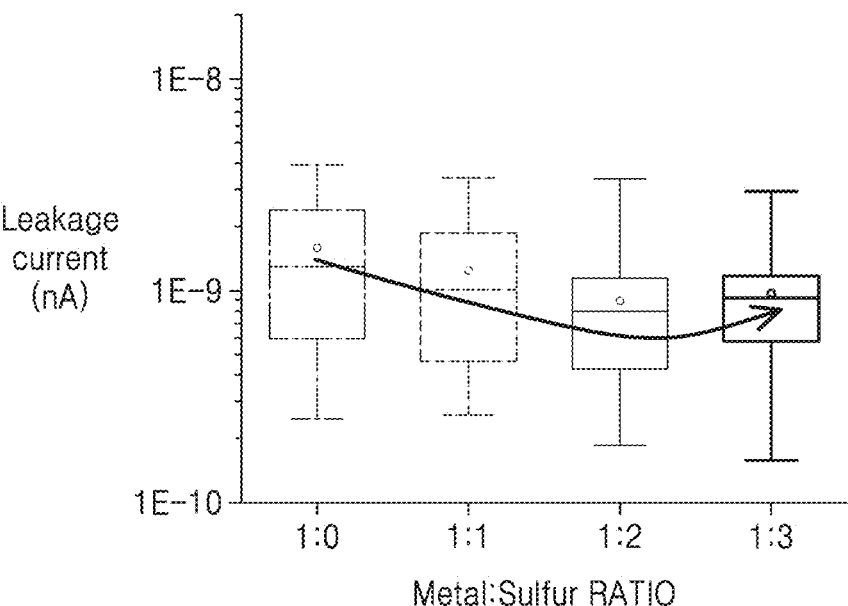
FIG. 3A is a graph illustrating a leakage current of a switching device according to various example embodiments.

FIG. 3A is a graph illustrating a leakage current of a switching device according to various example embodiments. Even when a voltage lower than a threshold voltage is applied to a semiconductor device (when the semiconductor device is in an off state), a certain level of current may flow in the selection layer, which is called a leakage current. Referring to FIG. 3A, the leakage current may be 1E-9 nA or 1 nA or less.

The aspect of the leakage current according to the mixing ratio of the metal and sulfur (S) is as follows. The magnitude of the leakage current decreases as the ratio of sulfur increases, and then increases as the ratio of sulfur increases based on the point where the ratio of metal to sulfur (S) is 1:2, approximately. It can be seen that the magnitude of the leakage current is minimized near the point where the ratio of metal to sulfur (S) is 1:2, approximately.

Figure 3B:
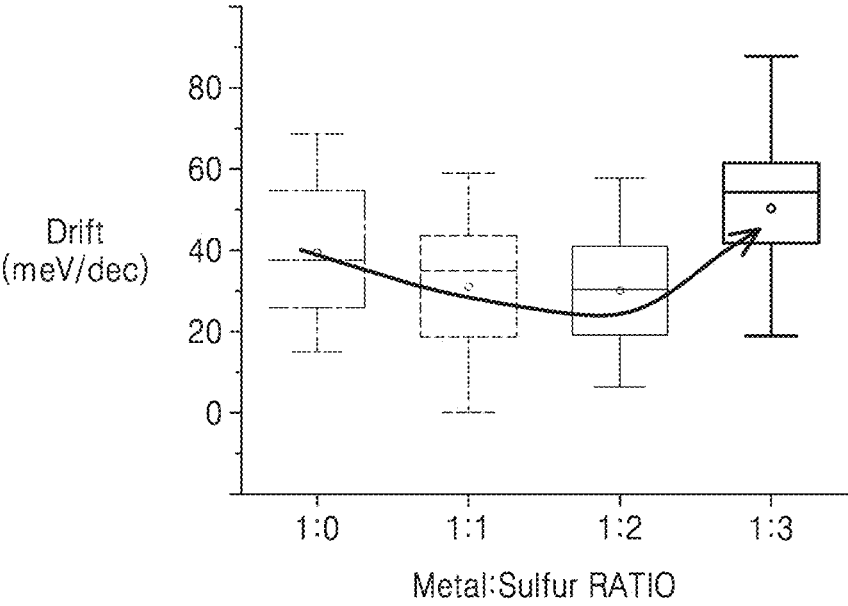
FIG. 3B is a graph illustrating a threshold voltage drift of a switching device according to various example embodiments.

FIG. 3B is a graph illustrating a threshold voltage drift of a switching device according to various example embodiments. Referring to FIG. 3B, the threshold voltage drift may be about 50 mV/dec or less, or about 40 mV/dec or less.

An aspect of the threshold voltage drift according to the mixing ratio of metal and sulfur (S) may be as follows. The magnitude of the threshold voltage drift decreases as the sulfur in the ratio increase, and then may increase as the ratio of sulfur increases based on the point where the ratio of metal to sulfur (S) is 1:2, approximately. The magnitude of the threshold voltage drift may be minimized in the vicinity of the point where the ratio of metal to sulfur (S) is 1:2, approximately.

Figure 3C:
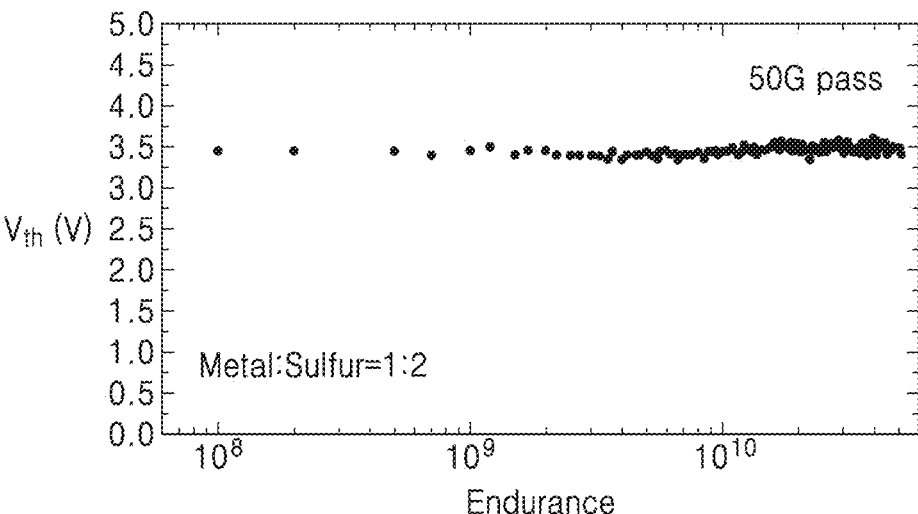
FIG. 3C is a graph of measuring endurance of a switching device according to various example embodiments.

FIG. 3C is a graph of measuring endurance of a switching device according to various example embodiments. Referring to FIG. 3C, endurance may be $5.0 \times 10^{10}$ times or more at a point where the ratio of metal to sulfur (S) is 1:2, approximately, in which the characteristics of the leakage current and the threshold voltage drift are improved. This endurance may be defined as the number of times that the threshold voltage may be on-off operable within the initial threshold voltage±15% (the average threshold voltage during the 1000 on-off cycles) using a pulse voltage having a rise and fall time of 10 ns and a width of 100 ns. The improved or excellent endurance of the switching device may be wholly or at least partially caused by the bonding of germanium (Ge), which is vulnerable to atomic migration in an electric field in frequent switching, to sulfur (S) and the bonding of selenium (Se) to a metal.

Figure 4:
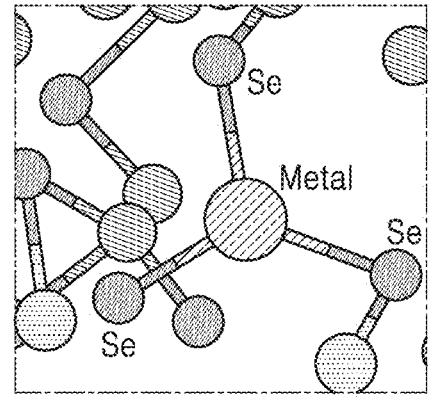
FIG. 4 is a diagram illustrating a simulation result of amorphous binding characteristics of a chalcogenide material according to various example embodiments.
Figure 4:
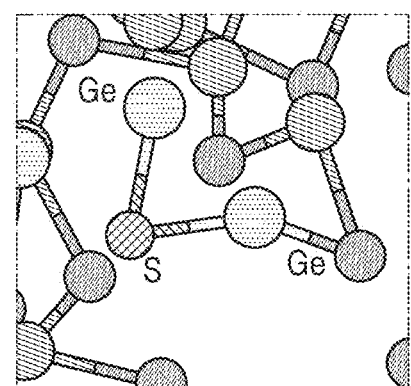

FIG. 4 is a diagram illustrating a simulation result of amorphous binding characteristics of a chalcogenide material according to various example embodiments.

Referring to FIG. 4, it may be confirmed that germanium (Ge) is bonded to sulfur (S), and selenium (Se) is bonded to metal. Due to such bonding, atomic migration under the electric field is suppressed, and thus, the switching device including the chalcogenide material and the memory device including the switching device have improved or excellent endurance to thereby implement stable switching characteristics in which a threshold voltage drift is suppressed.

The switching device according to various example embodiments may be applied to a memory cell and used for a switching operation of the memory cell.

Figure 5A:
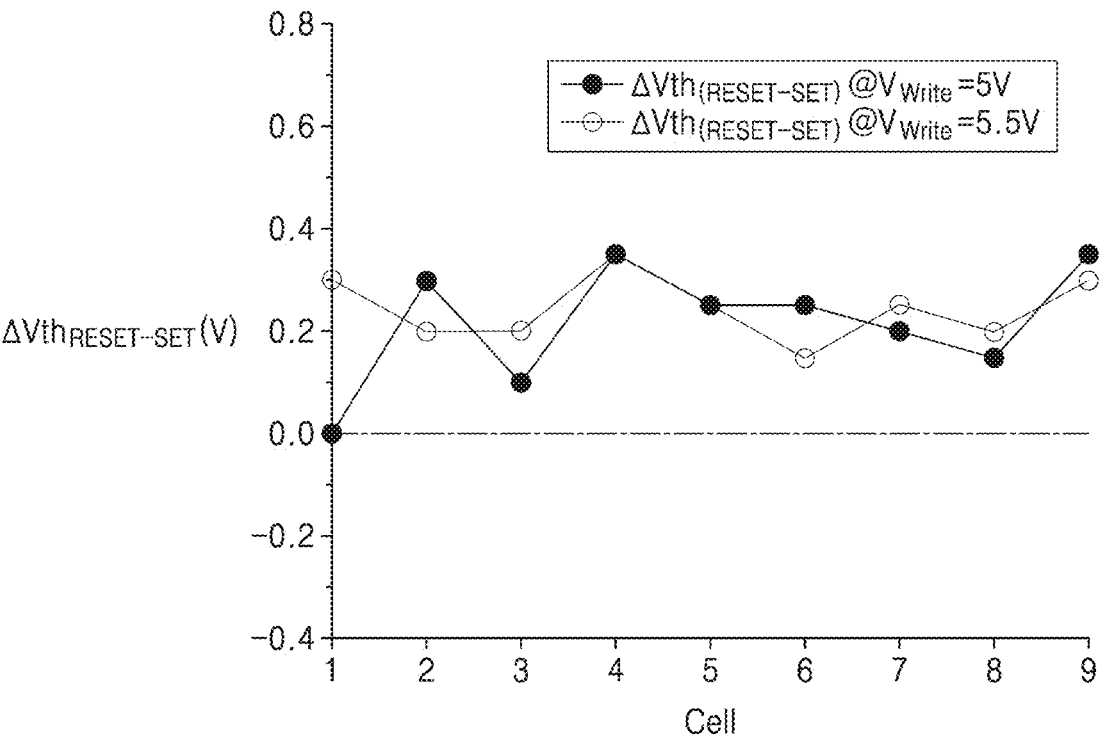
FIGS. 5A and 5B are graphs illustrating a change in a threshold voltage of a switching device according to a pulse according to various example embodiments.
Figure 5B:
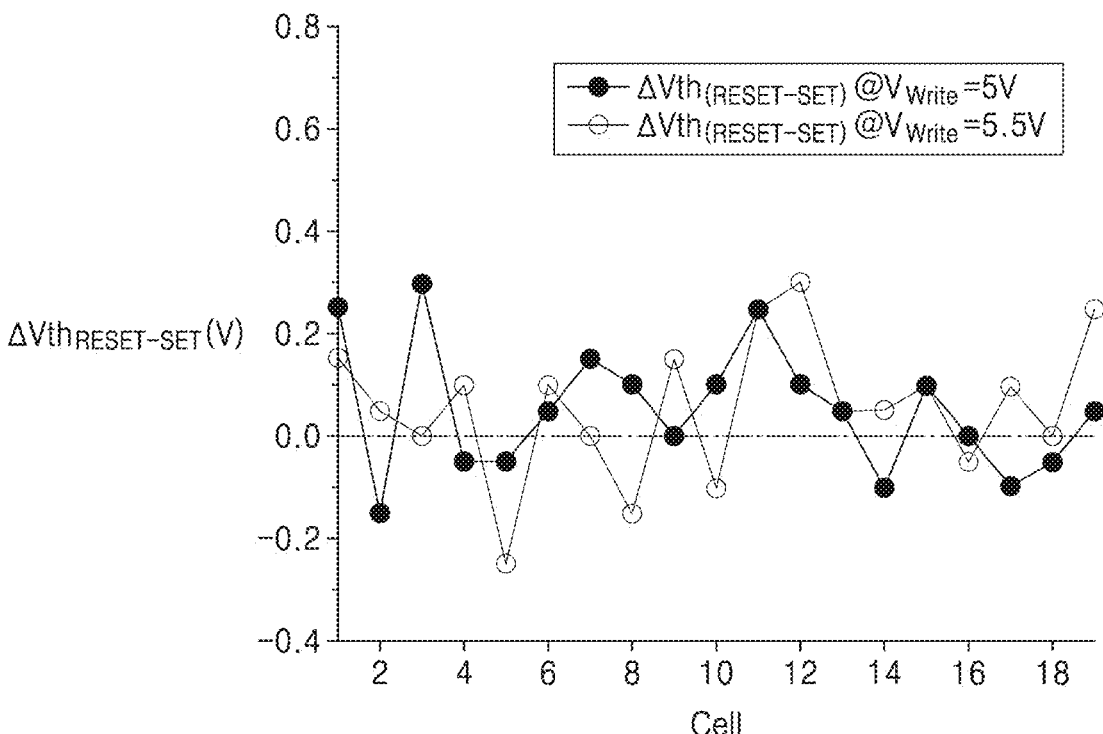

FIGS. 5A and 5B are graphs illustrating changes in threshold voltages of switching devices according to pulses.

FIG. 5A is a graph measuring the distribution of threshold voltage changes of a plurality of switching devices including a chalcogenide material having an arsenic (As) content of about 25%, and FIG. 5B is a graph measuring the distribution of threshold voltage changes of a plurality of switching devices including a chalcogenide material having an arsenic content of about 34%.

Referring to FIGS. 5A and 5B, a change in threshold voltage when a 5V voltage and a 5.5V voltage are respectively applied to the switching device may be seen. The threshold voltage change $\Delta$ Vth refers to a difference between threshold voltage values when a reset pulse and a set pulse are applied. In a case of a chalcogenide material having an arsenic (As) content of about 25%, the threshold voltage change ($\Delta$ Vth) is about 0.2 V on average, and in the case of a chalcogenide material having an arsenic content of about 34%, the threshold voltage change ($\Delta$ Vth) is about 0.1 V on average.

In a switching device and a memory device using a chalcogenide material having an arsenic (As) content of about 34% in a selection layer, threshold voltage drift is suppressed or reduced, thereby enhancing structural stability.

Figure 6:
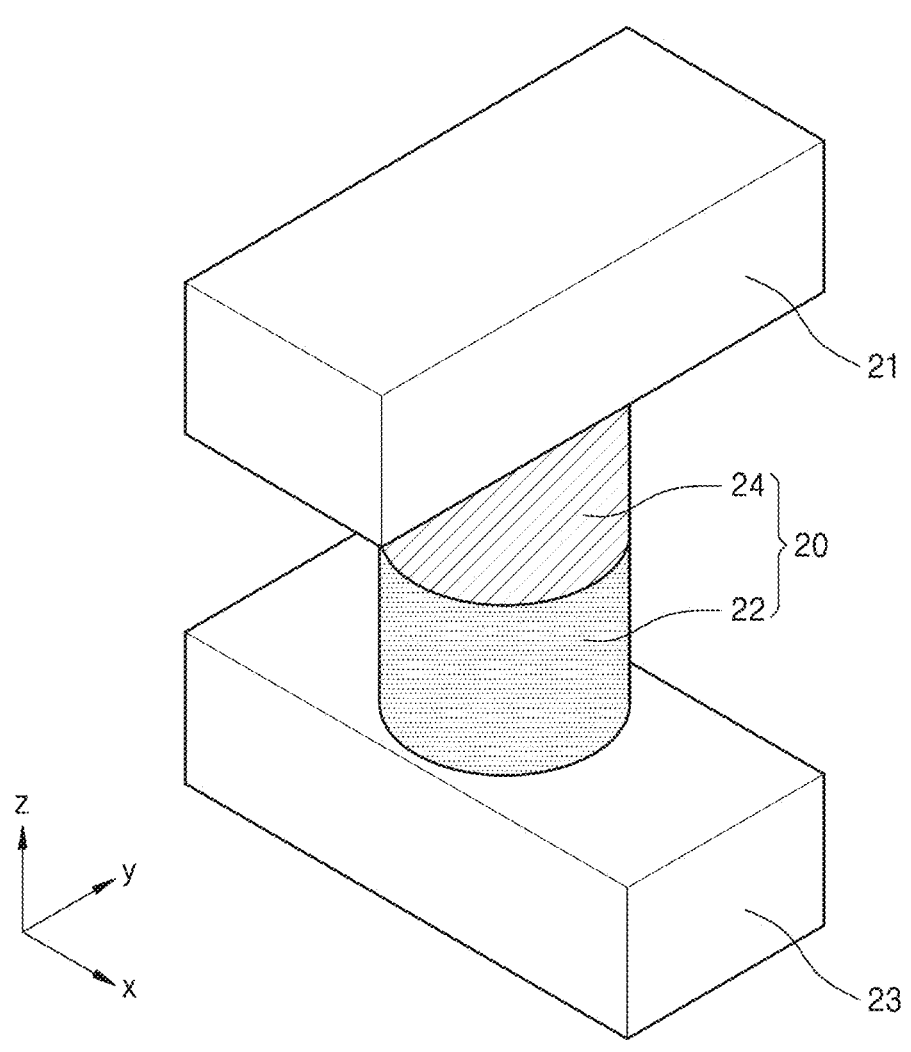
FIG. 6 is a perspective view of a memory cell according to various example embodiments.

FIG. 6 is a perspective view of a memory cell according to various example embodiments. Referring to FIG. 6, a memory cell 20 may include a selection layer 22 and a variable resistor layer 24, which are electrically connected between the first electrode layer 21 and the second electrode layer 23. For example, the selection layer 22 may be electrically connected to the second electrode layer 23, and the variable resistor layer 24 may be electrically connected to the first electrode layer 21. The selection layer 22 and the variable resistor layer 24 may be electrically connected to each other in series.

In the memory cell 20 of FIG. 6, the selection layer 22 may function as a switch element together with the first electrode layer 21 and the second electrode layer 23. When a voltage greater than a threshold voltage is applied between the first electrode layer 21 and the second electrode layer 23 of the switching device, the selection layer 22 becomes a low resistance state to start or enable a current flow, and when a voltage less than a threshold voltage is applied between the first electrode layer 21 and the second electrode layer 23 of the switching device, the selection layer 22 returns to a high resistance state so that no or a reduced or minimal current flows. In addition, when the current flowing through the selection layer 22 becomes smaller than the holding current, the selection layer 22 may be changed to a high resistance state. Accordingly, the switching device may be turned on/off according to a voltage applied between the first electrode layer 21 and the second electrode layer 23.

The variable resistor layer 24 may store information. The resistance value of the variable resistor layer 24 may vary depending on the applied voltage. For example, the variable resistance layer 24 may include a phase change material that reversibly changes between an amorphous state and a crystalline state according to the heating time. The phase change material may be in a high resistance state in the amorphous state, and may be in a low resistance state in the crystalline state. By defining the high resistance state as '0' and the low resistance state as '1', data may be stored in the switching device.

The first electrode layer 21 and the second electrode layer 23 may be paths through which current flows. The first electrode layer 21 and the second electrode layer 23 may be formed of a conductive material. For example, the conductive material may be independently made of a metal, a conductive metal oxide, a conductive metal nitride, or a combination thereof. For example, the conductive material may include one or more selected from carbon (C), titanium nitride (Ti), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), and is not limited thereto.

Figure 7:
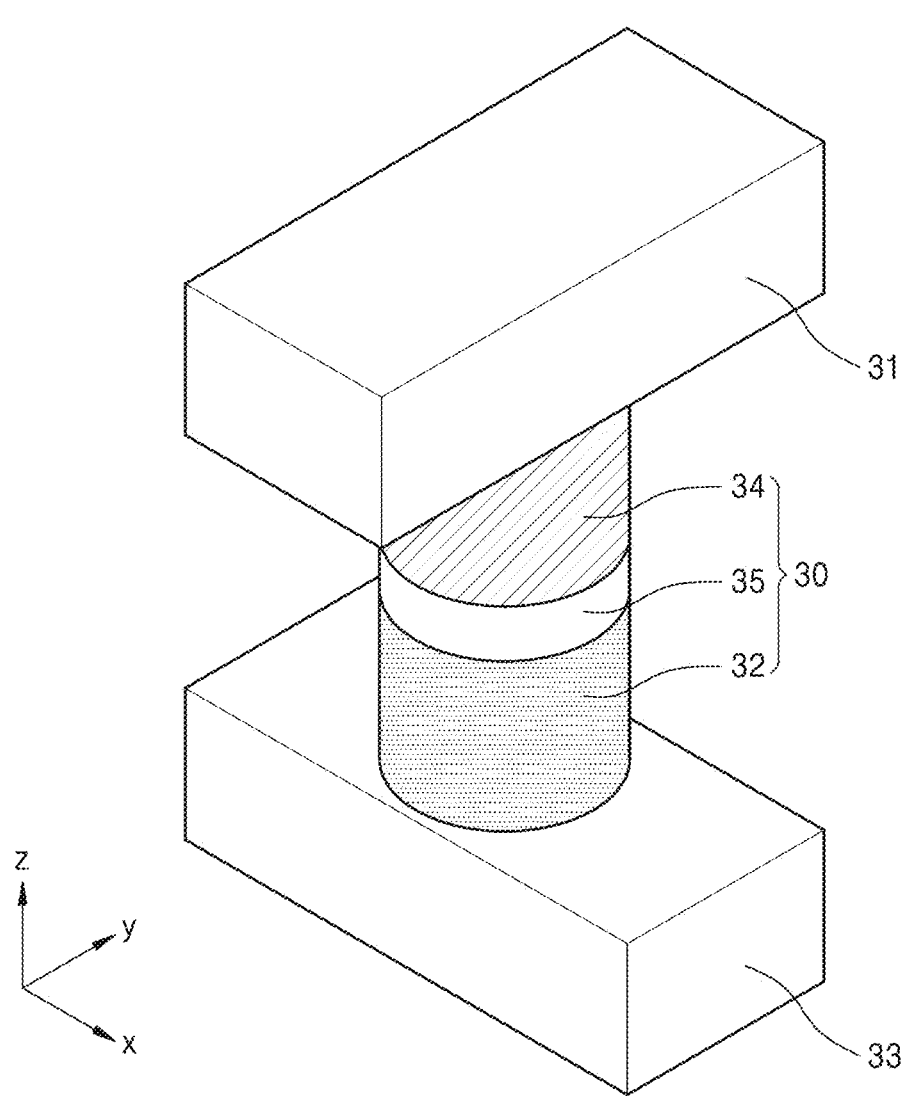
FIG. 7 is a perspective view of a memory cell according to various example embodiment.

FIG. 7 is a perspective view of a memory cell according to various example embodiments. Referring to FIG. 7, a memory cell 30 may further include a third electrode layer 35 between a selection layer 32 and a variable resistor layer 34 and electrically connecting the selection layer 32 to the variable resistor layer 34. In addition, the variable resistor layer 34 may be arranged between a first electrode layer 31 and the third electrode layer 35, and the selection layer 32 may be arranged between a second electrode layer 33 and the third electrode layer 35.

The third electrode layer 35 may function as a heating electrode layer. The third electrode layer 35 may function to heat the memory cell 30 in the operation of writing from the high resistance state "0" to the low-resistance state "1" and/or the operation of writing from the low-resistance state "1" to the high-resistance state "0".

The first electrode layer 31, the second electrode layer 33, and the third electrode layer 35 may be or may correspond to paths through which current flows or is enabled to flow. The first electrode layer 31, the second electrode layer 33, and the third electrode layer 35 may be formed of or include a conductive material. For example, the conductive material may be independently made of a metal, a conductive metal oxide, a conductive metal nitride, or a combination thereof. For example, the conductive material may include one or more selected from carbon (C), titanium nitride (Ti), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), and is not limited thereto.

The third electrode layer 35 may be formed of the same conductive material as the first electrode layer 31 and the second electrode layer 33, and/or may further include one or more of tantalum silicon nitride (TaSiN), tantalum aluminum nitride (TaAlN), tungsten silicide (WSi), titanium tungsten (TiW), molybdenum nitride (MoN), niobium nitride (NbN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), titanium aluminum (TiAl), titanium oxynitride (TiON), titanium aluminum oxynitride (TiAlON), tungsten oxynitride (WON), tantalum oxynitride (TaON), silicon carbon (SiC), silicon carbon nitride (SiCN), carbon nitride (CN), tantalum carbon nitride (TaCN), or a high melting point metal that is a combination thereof, or a nitride thereof, but is not limited thereto.

According to various example embodiments, the second electrode layer 33 may correspond to the first electrode layer 11 of FIG. 1, the selection layer 32 may correspond to the selection layer 12 of FIG. 1, and the third electrode layer 35 may correspond to the second electrode layer 13 of FIG. 1.

The memory cell 30 may have a pillar shape. For example, the memory cell 30 MC may have a prismatic and/or cylindrical and/or tapered shape, and may have various pillar shapes, such as a square pillar, an oval pillar, and a polygonal pillar.

The side surface of the memory cell 30 may be perpendicular to a substrate. For example, the memory cell 30 may have a constant cross-sectional area of the cross-section perpendicular to the stacking direction (Z direction), but this is an example and the memory cell 30 may have a structure in which the upper part of the memory cell 30 is wider than the lower part thereof or the lower part thereof is wider than the upper part thereof. Alternatively or additionally, the selection layer 32 and the variable resistor layer 34 may each independently have the same or different upper and lower areas. This shape may vary depending on the method of forming each component.

Figure 8:
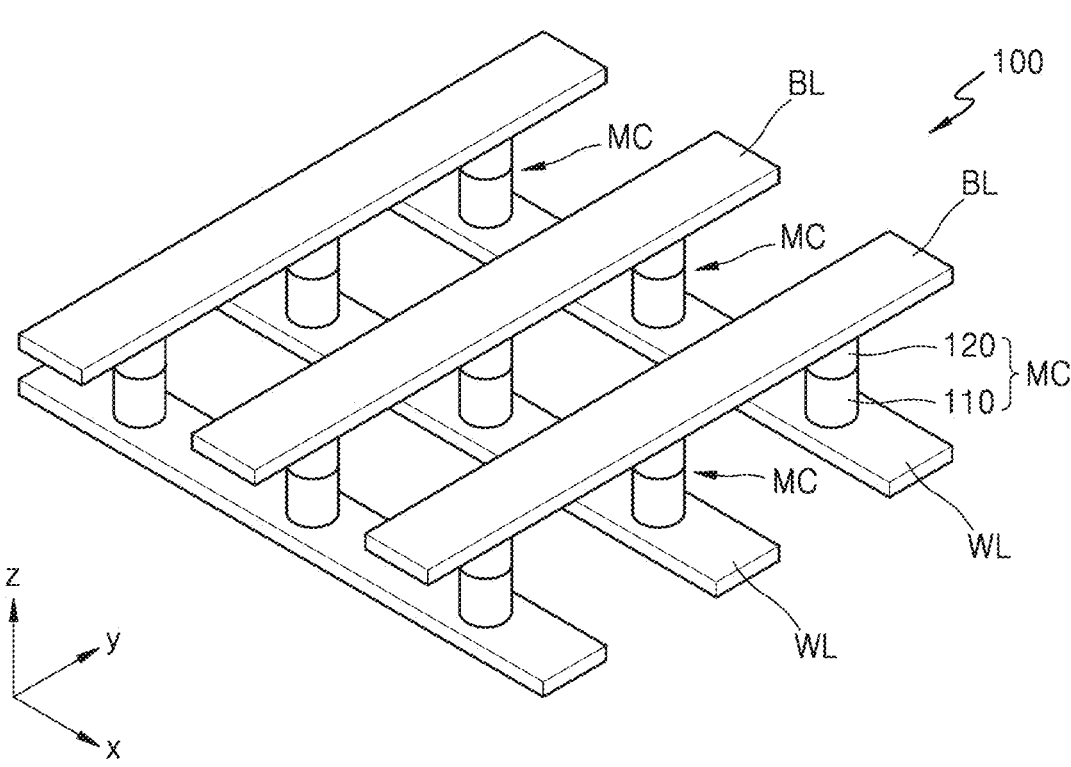
FIG. 8 is an equivalent circuit diagram of a memory device according to various example embodiments.

FIG. 8 is an equivalent circuit diagram of a memory cell according to various example embodiments.

Referring to FIG. 8, a memory device 100 may include a plurality of memory cells MC, and the memory cell MC may be the memory cell 20 of FIG. 6 or the memory cell 30 of FIG. 7. The memory device 100 may have a three-dimensional (3D) cross-point array structure. The memory device 100 may include first electrode lines WL and second electrode lines BL, which are at different levels. The memory device 100 may include the first electrode lines WL extending in the first direction (X direction) and spaced apart in a second direction (Y direction) perpendicular to the first direction. In addition, the memory device 100 may include the second electrode lines BL spaced apart from the first electrode lines WL in a third direction (Z direction) and extending in parallel with each other in the second direction crossing the first direction.

The memory cells MC may be arranged between the first electrode lines WL and the second electrode lines BL, respectively. The memory cells MC may be electrically connected to the first electrode lines WL and the second electrode lines BL and may be arranged at intersections thereof, respectively. The memory cells MC may be arranged in a matrix form, such as but not limited to a square matrix for or a rectangular matrix form. Each of the memory cells MC may include a variable resistor layer 120 for storing information and a selection layer 110 for selecting the memory cells MC. For example, the variable resistor layer 120 and the selection layer 110 may be connected in series in the third direction (Z direction), the selection layer 110 may be electrically connected to one of the first electrode line WL and the second electrode line BL, and the variable resistor layer 120 may be electrically connected to the other of the first electrode line WL and the second electrode line BL. Various voltage signals and/or current signals may be provided through the first electrode lines WL and the second electrode lines BL, and thus, data may be written and/or read with respect to the selected memory cell MC, and data may be prevented from being written or read with respect to the remaining memory cells MC.

The array of memory cells MC may have a multi-deck or multi-stack structure. The memory cells MC may be stacked in the third direction (Z direction). For example, the array of memory cells MC may have a multi-deck structure in which the first electrode line WL and the second electrode line BL are alternately stacked in the third direction (Z direction). In this case, the memory cell MC may be positioned between the first electrode line WL and the second electrode line BL, which are alternately stacked.

The memory cells MC may be arranged having the same structure in the third direction (Z direction). For example, in the memory cell MC arranged between the first electrode line WL and the second electrode line BL, the variable resistor layer 120 is electrically connected to the second electrode line BL, the selection layer 110 is electrically connected to the first electrode line WL, and the variable resistor layer 120 and the selection layer 110 may be connected in series, but the embodiments are not limited thereto. For example, unlike FIG. 7, the positions of the selection layer 110 and the variable resistor layer 120 may be changed with each other in the memory cell MC. For example, in the memory cell MC, the variable resistor layer 120 may be electrically connected to the first electrode line WL, and the selection layer 110 may be electrically connected to the second electrode line BL.

The selection layer 110 may control a flow of current with respect to the memory device 100 electrically connected to the selection layer 110 to select the memory device 100 corresponding to the selection layer 110. For example, the selection layer 110 may include a material capable of changing resistance according to the magnitude of the voltage applied across both ends thereof. For example, the selection layer 110 may have an OTS characteristic.

Since the selection layer 110 has improved or excellent thermal stability, damage and/or degradation may be reduced in a process of manufacturing a semiconductor device, etc. Specifically, the selection layer 110 may have a crystallization temperature of 350° C. or more and 600° C. or less. For example, the crystallization temperature of the selection layer 110 may be 380° C. or more, 400° C. or more, 580° C. or less, or 550° C. or less. Alternatively or additionally, the selection layer 110 may have a sublimation temperature of 250° C. or more and 400° C. or less. For example, the sublimation temperature may be 280° C. or more, 300° C. or more, 380° C. or less, or 350° C. or less.

The variable resistor layer 120 may store information. For example, the resistance value of the variable resistor layer 120 may vary depending on the applied voltage. The memory device 100 may store and erase digital information, such as "0" or "1", according to a change in resistance of the variable resistor layer 120. For example, the memory device 100 may write data at a high resistance state of the variable resistor layer 120 to "0" and data at a low resistance state thereof to "1". Here, writing from the high resistance state "0" to the low resistance state "1" may be referred to as a "set operation", and writing from the low resistance state "1" to the high resistance state "0" may be referred to as a "reset operation".

A method of driving the memory device 100 will be briefly described below. The memory device 100 may have a voltage applied to the variable resistor layer 120 of the memory cell MC through the first electrode line WL and the second electrode line BL to allow a current to flow. The variable resistor layer 120 may be changed to one of a plurality of resistance states by an electric pulse applied thereto. The variable resistance layer 120 may include a phase change material in which a crystal state changes according to an amount of current. The phase change material may be changed into an amorphous state having a relatively high resistance, or to a crystal state having a relatively low resistance. The phase of the phase change material may be reversibly changed by Joule's heat generated by a voltage applied across both ends of the memory element, and data may be stored in the memory device 100 through the phase change. The phase change material may include a chalcogenide material. The variable resistor layer 120 may have a multi-layer structure in which two or more layers having different physical properties are stacked, or may have a super-lattice structure in which a plurality of layers including different materials are alternately stacked. Each element constituting or included in the phase change material may have various chemical composition ratios (stoichiometry), and the crystallization temperature and melting point of the phase change material, phase change speed according to crystallization energy, and information retention may be controlled according to the chemical composition ratio of each element. For example, the chemical composition ratio (stoichiometry) may be adjusted so that the melting point of the phase change material may be about 500° C. to about 800° C.

Alternatively or additionally, any memory cell MC may be addressed by selecting the first electrode line WL and the second electrode line BL, and a predetermined signal may be applied between the selected first electrode line WL and the selected second electrode line BL to program the memory cell MC. In addition, by measuring the current value through the second electrode line BL, information according to the resistance value of the variable resistor layer 120 of the memory cell MC, that is, programmed information, may be read.

The memory device 100 may be or may include phase-change random access memory (PRAM) or resistive random access memory (RRAM). However, this is merely an example, and the memory device 100 may be or may include one or more of a magnetic random access memory (MRAM), a memristor, or the like.

When a material of the memory element included in the memory device 100 includes a phase change material that reversibly changes between an amorphous state and a crystalline state, the memory device 100 may be PRAM. The phase of the PRAM may be reversibly changed by Joule's heat generated by a voltage applied across both ends of the memory element, and data may be stored in the memory element through the phase change. For example, the phase change material may be in a high resistance state in the amorphous state, and may be in a low resistance state in the crystalline state. By defining the high resistance state as '0' and the low resistance state as '1', data may be stored in the memory element.

When the material of the memory element included in the memory device 100 includes a transition metal oxide, the memory device 100 may be RRAM. In the memory element including the transition metal oxide, at least one electrical path may be created or destroyed in the memory element by a program operation. When the electrical path is created, the memory element may have a low resistance value, and when the electrical path is destroyed, the memory element may have a high resistance value. Data may be stored in the memory device 100 by using the difference in the resistance value of the memory element. The transition metal oxide may include at least one metal selected from tantalum (Ta), zirconium (Zr), titanium (Ti), hafnium (Hf), manganese (Mn), yttrium (Y), nickel (Ni), cobalt (Co), zinc (Zn), niobium (Nb), copper (Cu), iron (Fe), and chromium (Cr).

Alternatively or additionally, when the memory element has a magnetic tunnel junction (MTJ) structure including two electrodes formed of a magnetic material and a dielectric between the two magnetic electrodes, the memory device 100 may be MRAM. The two electrodes may be a magnetization fixing layer and a magnetization free layer, respectively, and the dielectric therebetween may be a tunnel barrier layer. The magnetization fixing layer may have a magnetization direction fixed in one direction, and the magnetization free layer may have a magnetization direction that may be changed to be parallel or semi-parallel to the magnetization direction of the magnetization fixing layer. The magnetization directions of the magnetization fixing layer and the magnetization free layer may be parallel to one surface of the tunnel barrier layer, but are not limited thereto. The magnetization directions of the magnetization fixing layer and the magnetization free layer may be perpendicular to one surface of the tunnel barrier layer. When the magnetization direction of the magnetization free layer is parallel to the magnetization direction of the magnetization fixing layer, the memory element may have a first resistance value. When the magnetization direction of the magnetization free layer is inversely parallel to the magnetization direction of the magnetization fixing layer, the memory element may have a second resistance value. Data may be stored in the memory device 100 using the difference in the resistance value of the memory element. The magnetization fixing layer has a magnetization direction fixed in one direction, and the magnetization free layer may have a magnetization direction changed by a spin torque of internal electrons. The magnetization fixing layer and the magnetization free layer may include a magnetic material. In this case, the magnetization fixing layer may further include an antiferromagnetic material that fixes the magnetization direction of the ferromagnetic material in the magnetization fixing layer. The tunnel barrier layer may be an oxide of at least one selected from magnesium (Mg), titanium (Ti), aluminum (Al), and zinc (Zn), but is not limited thereto.

Accordingly, according to various example embodiments, it may be confirmed that a switching device and a memory device having structural stability improved and threshold voltage drift suppressed may be provided.

The chalcogenide material, the switching device including the chalcogenide material, and/or the memory device including the switching device have been described with reference to various example embodiments shown in the drawings. According to example embodiments, the chalcogenide material includes: germanium (Ge); arsenic (As); sulfur (S); selenium (Se); and at least one group III metal selected from indium (In), gallium (Ga), and aluminum (Al), and the switching device and the memory device using the chalcogenide material as the selection layer may have improved or excellent endurance by suppressing or reducing a threshold voltage drift.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

It should be understood that various example embodiments described herein should be considered in a descriptive sense only and not for purposes of limitation. Descriptions of features and/or aspects within each embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A chalcogenide material comprising:
germanium (Ge);
arsenic (As);
sulfur(S) and no silicon (Si);
selenium (Se); and
at least one group III metal selected from indium (In), gallium (Ga), and aluminum (Al), wherein
a content of Ge is greater than about 10 at % and less than or equal to about 30 at %,
a content of As is greater than about 30 at % and less than or equal to about 50 at %,
a content of Se is greater than about 20 at % and less than or equal to about 60 at %,
a content of S is greater than about 0.5 at % and less than or equal to about 10 at %, and
a content of the at least one group III metal is greater than about 0.5 at % and less than or equal to about 10 at %.

2. The chalcogenide material of claim 1, wherein a ratio of the content of the at least one group III metal and the content of the S is 1:1 or more and 1:10 or less.

3. The chalcogenide material of claim 1, wherein a sum of the content of the S and the content of the Se is greater than about 20 at % and less than or equal to about 60 at %.

4. The chalcogenide material of claim 1, wherein
the Ge is bonded to the S, and
the Se is bonded to the at least one group III metal.

5. The chalcogenide material of claim 1, wherein the content of the As is greater than about 35 at % and less than or equal to about 50 at %.

6. The chalcogenide material of claim 1, wherein the content of the As is greater than about 40 at % and less than or equal to about 50 at %.

15

7. A switching device comprising:

a first electrode layer;

a second electrode layer facing the first electrode layer; and a selection layer arranged between the first electrode layer and the second electrode layer, wherein the selection layer comprises a chalcogenide material including: germanium (Ge); arsenic (As); sulfur(S) and no silicon (Si); selenium (Se); and at least one group III metal selected from indium (In), gallium (Ga), and aluminum (Al), and wherein a content of Ge is greater than about 10 at % and less than or equal to about 30 at %, a content of As is greater than about 30 at % and less than or equal to about 50 at %, a content of Se is greater than about 20 at % and less than or equal to about 60 at %, a content of S is greater than about 0.5 at % and less than or equal to about 10 at %, and a content of the at least one group III metal is greater than about 0.5 at % and less than or equal to about 10 at %.

8. The switching device of claim 7, wherein a ratio of the content of the at least one group III metal to the content of the S is 1:1 or more and 1:10 or less.

9. The switching device of claim 7, wherein a sum of the content of the S and the content of the Se is greater than about 20 at % and less than or equal to about 60 at %.

10. The switching device of claim 7, wherein the Ge is bonded to the S, and the Se is bonded to the at least one group III metal.

11. The switching device of claim 7, wherein the content of the As is greater than about 35 at % and less than or equal to about 50 at %.

12. The switching device of claim 7, wherein the content of the As is greater than about 40 at % and less than or equal to about 50 at %.

13. The switching device of claim 7, wherein the chalcogenide material exhibits ovonic threshold switching material characteristics.

14. A memory device comprising:

a plurality of first electrode lines extending in a first direction and spaced apart from each other;

a plurality of second electrode lines extending in a second direction crossing the first direction and spaced apart from each other, and

16 a plurality of memory cells electrically connected between the plurality of the first electrode lines and the plurality of the second electrode lines, respectively, at intersections of the plurality of the first electrode lines and the plurality of the second electrode lines, wherein each of the plurality of memory cells includes a selection layer and a variable resistor layer which are connected in series, the selection layer includes a chalcogenide material including: germanium (Ge); arsenic (As); sulfur(S) and no silicon (Si); selenium (Se); and at least one group III metal selected from indium (In), gallium (Ga), and aluminum (Al), and wherein a content of the Ge is greater than about 10 at % and less than or equal to about 30 at %, a content of the As is greater than about 30 at % and less than or equal to about 50 at %, a content of Se is greater than about 20 at % and less than or equal to about 60 at %, a content of S is greater than about 0.5 at % and less than or equal to about 10 at %, and a content of the at least one group III metal is greater than about 0.5 at % and less than or equal to about 10 at %.

15. The memory device of claim 14, wherein a ratio of the content of the at least one group III metal to the content of the S is 1:1 or more and 1:10 or less.

16. The memory device of claim 14, wherein a sum of the content of the S and the content of the Se is greater than about 20 at % and less than or equal to about 60 at %.

17. The memory device of claim 14, wherein the chalcogenide material exhibits ovonic threshold switching material characteristics.

18. The memory device of claim 14, further comprising:

a third electrode layer between the selection layer and the variable resistor layer.

19. The memory device of claim 14, comprising a three-dimensional (3D) cross-point array structure.

20. The memory device of claim 14, comprising one or more of a phase-change random access memory (PRAM), resistive random access memory (RRAM), or magnetic random access memory (MRAM).

* * * * *